United States Patent [19]

Ireland et al.

[11] Patent Number: 4,457,662
[45] Date of Patent: Jul. 3, 1984

[54] AUTOMATIC LEAD FRAME LOADING MACHINE

[75] Inventors: Ronald Ireland, Philadelphia; Harold R. Powell, King of Prussia, both of Pa.

[73] Assignee: Pennwalt Corporation, Philadelphia, Pa.

[21] Appl. No.: 361,936

[22] Filed: Mar. 25, 1982

[51] Int. Cl.³ .......................... B65G 1/06; B65G 25/04
[52] U.S. Cl. ...................................... 414/331; 29/743; 29/827; 198/403; 198/434; 198/689; 414/763; 414/783
[58] Field of Search ............... 198/403, 434, 689, 404, 198/409; 414/222, 331, 403, 404, 417, 737, 761–763, 31, 33, 119, 131, 764–767, 773, 783; 29/743, 759, 827

[56] References Cited

U.S. PATENT DOCUMENTS

| 1,836,690 | 12/1931 | Talbot | 414/737 X |
| 3,753,509 | 8/1973 | Kock | 414/737 X |
| 4,194,865 | 3/1980 | Bandoh | 414/403 |
| 4,278,380 | 7/1981 | Guarino | 414/222 X |
| 4,373,846 | 2/1983 | Charbonnet | 414/417 X |

Primary Examiner—Robert J. Spar
Assistant Examiner—Janice Krizek

[57] ABSTRACT

Lead frames with semiconductor microcircuit chips bonded thereto are automatically rapidly precisely loaded onto loading frames for subsequent encapsulation of the chips. The lead frames are contained within magazines, each lead frame resting on a separate rack therewithin. An air-actuated piston causes a plurality of pusher bars to each eject a lead frame from each of a plurality of the magazines, horizontally disposed, onto a nest member which pivots to invert the lead frames ejected thereon onto the loading frame. The lead frames are precisely positioned on the nest member early in the pivot thereof when the lead frame are caused to slide downwardly on the smooth-surfaced nest member to thereby contact an abutment and to be retained in that precise position by vacuum until deposited on the loading frame.

16 Claims, 10 Drawing Figures

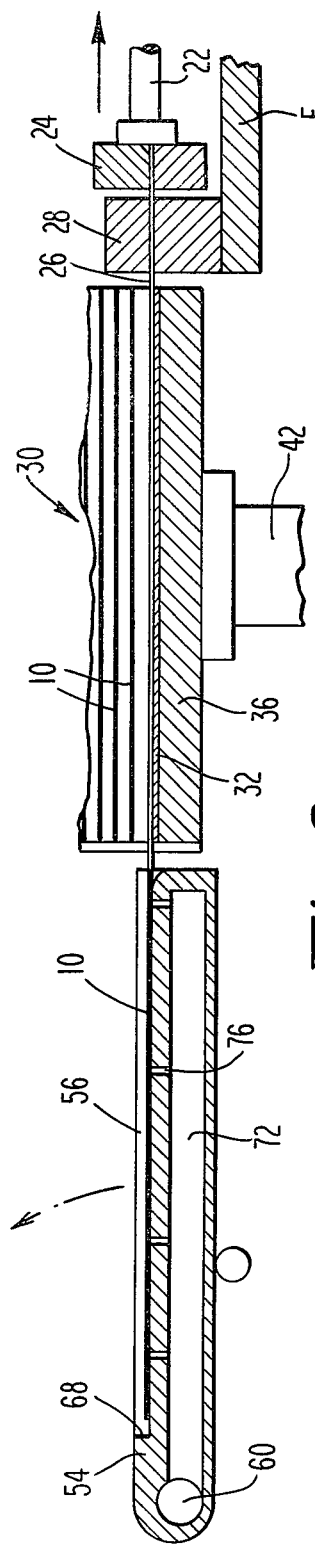
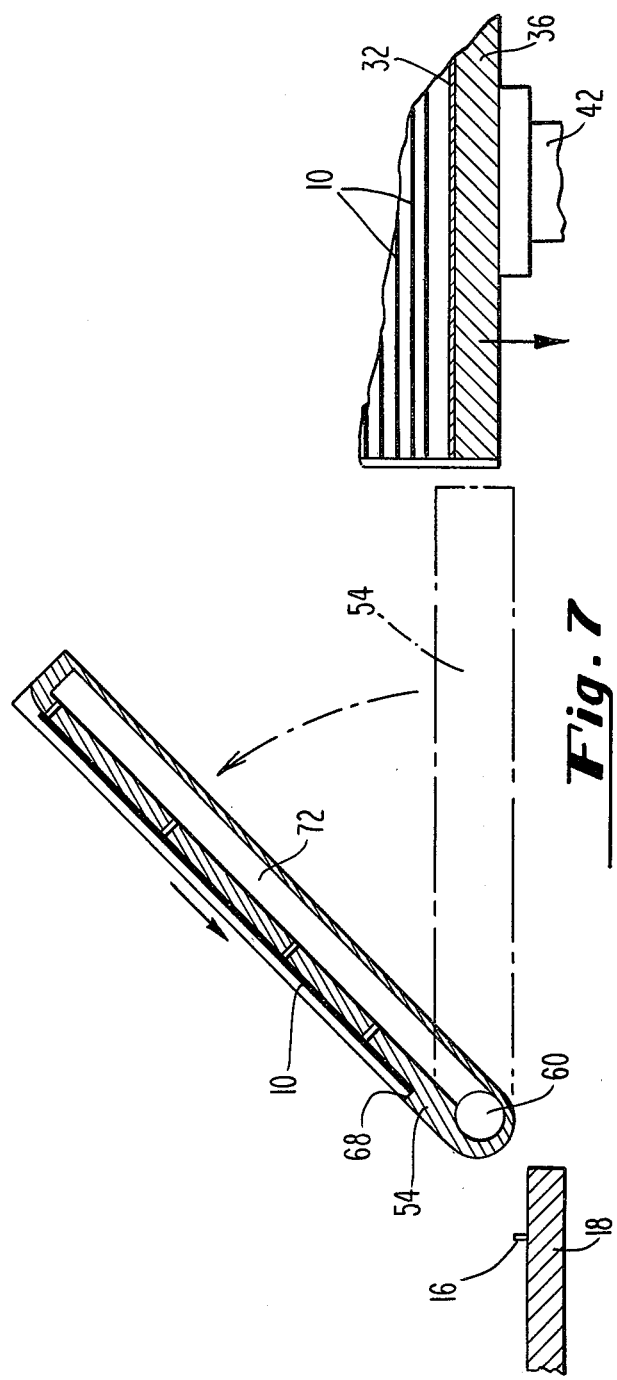

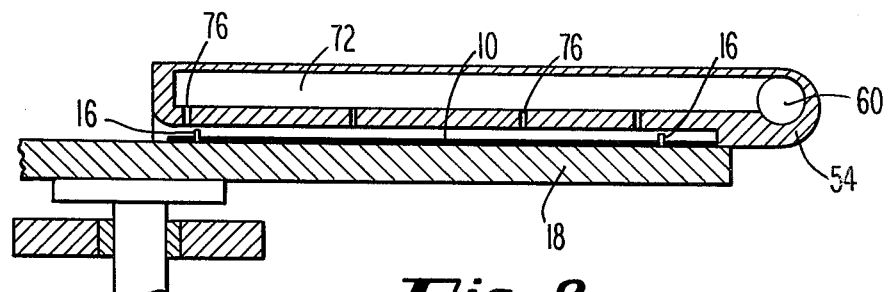
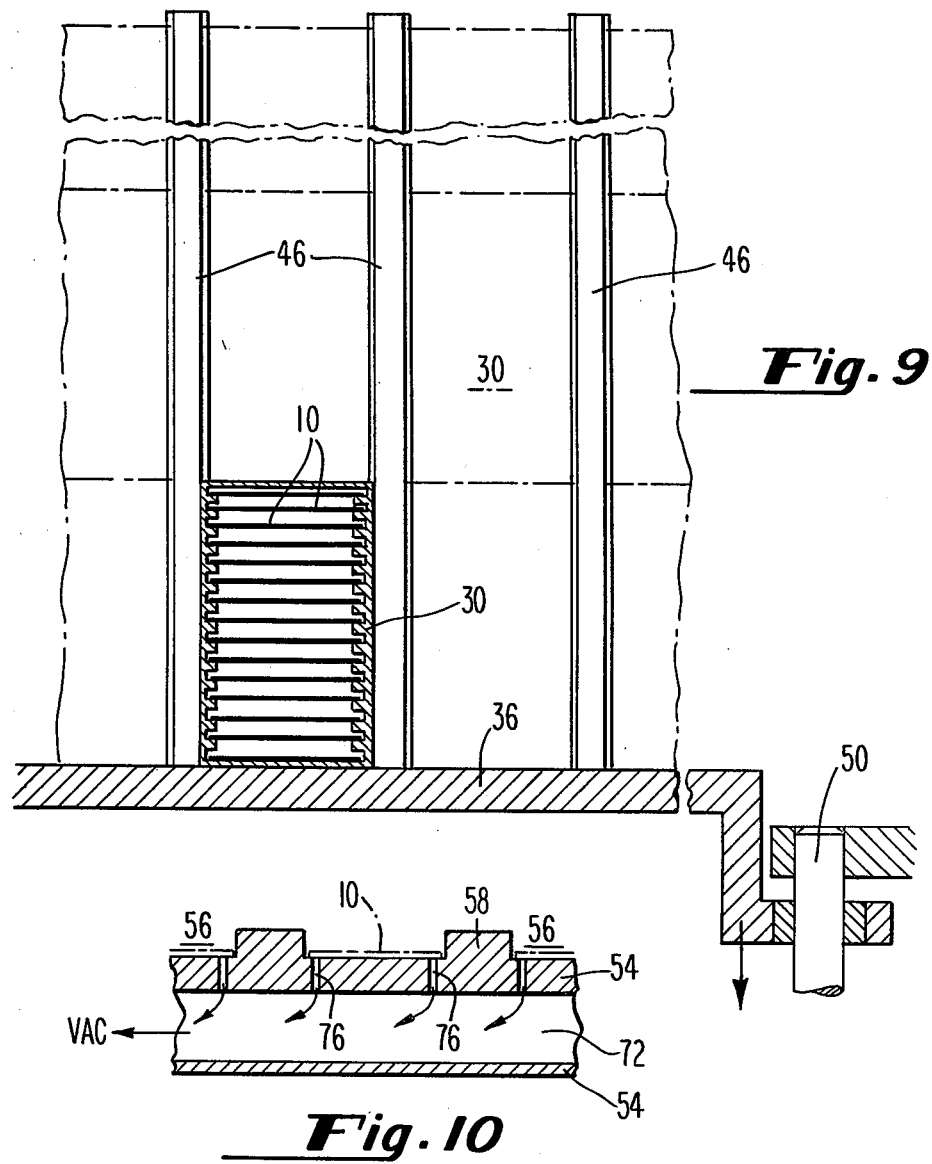

AUTOMATIC LEAD FRAME LOADING MACHINE

STATEMENT OF THE INVENTION

This invention relates to apparatus for automatically rapidly loading lead frames onto loading frames for subsequent encapsulation of semiconductor circuit chips previously bonded to the lead frames.

BACKGROUND AND SUMMARY OF THE INVENTION

A typical lead frame is a metallic strip, approximately 1"×9", onto which about 10 to 15 semiconductor microcircuit chips are bonded. After bonding, the chips must be encapsulated with a suitable thermosetting epoxy material, for example, which completely encapsulates each chip, and necessarily a small portion of the lead frame onto which the chips are bonded. Typically, the lead frames with microcircuit chips bonded thereto, will be inserted into a molding press and encapsulated with the thermosetting material by the process known as transfer molding. After each chip of the lead frame is individually encapsulated, each encapsulated chip will be separated from the lead frame into a discrete device for subsequent use in electronic applications of diverse nature.

The practice commonly employed in the industry is to manually load the lead frames onto a loading frame positioned atop a heating plate. The loading frames are subsequently positioned in an encapsulation mold for encapsulation of the chips.

The present invention provides a machine which automatically rapidly loads lead frames with the chips already bonded thereto onto loading plates or frames for encapsulation of the chips.

The lead frames, complete with bonded microcircuit chips, are supplied in magazine type containers by the various electronic companies for encapsulation of the chips. The companies prefer using magazines of their own design or choice but typically include slotted storage racks capable of containing a lead frame on each of the 10 to 50 or more racks. The magazine serves to protect the vertically stacked lead frames with their microcircuit chips delicately soldered thereto. The lead frames stacked within the magazines are automatically individually removed therefrom and ultimately automatically loaded in precise position onto the loading frames.

Briefly, the present invention includes an air cylinder having a piston which causes a plurality of parallel connected pusher blades to each eject a lead frame from a separate magazine wherein a row of such magazines, equal in number to the pusher blades, is horizontally disposed. The lead frames are ejected onto a nest member which pivots 180° to deposit the lead frames onto the loading frame. The lead frames are precisely positioned on the pivoting nest member during uninterrupted rotation thereof. More specifically, after about 45° of rotation of the nest member, the lead frames slide downwardly on the smooth surfaced nest member a short distance to contact an abutment; and vacuum means applied to the nest member immediately after contact maintains the lead frames in a precise position on the nest member, i.e., in contact with the abutment, until deposited onto the loading frame upon completion of its 180° rotation. The loading frame may then be automatically rotated in order to accept another set of lead frames on its remaining half prior to being replaced by an empty loading frame.

BRIEF DESCRIPTION OF THE DRAWINGS

FIG. 5 is a fragmentary perspective view of the loading machine.

FIGS. 6, 7 and 8 are fragmentary sectional views of the loading machine illustrating sequential steps of depositing lead frames onto a loading frame.

FIGS. 9 and 10 are fragmentary sectional views of the loading machine of FIG. 4 taken along lines 9—9 and 10—10 respectively.

DETAILED DESCRIPTION OF THE INVENTION

Figure 1:
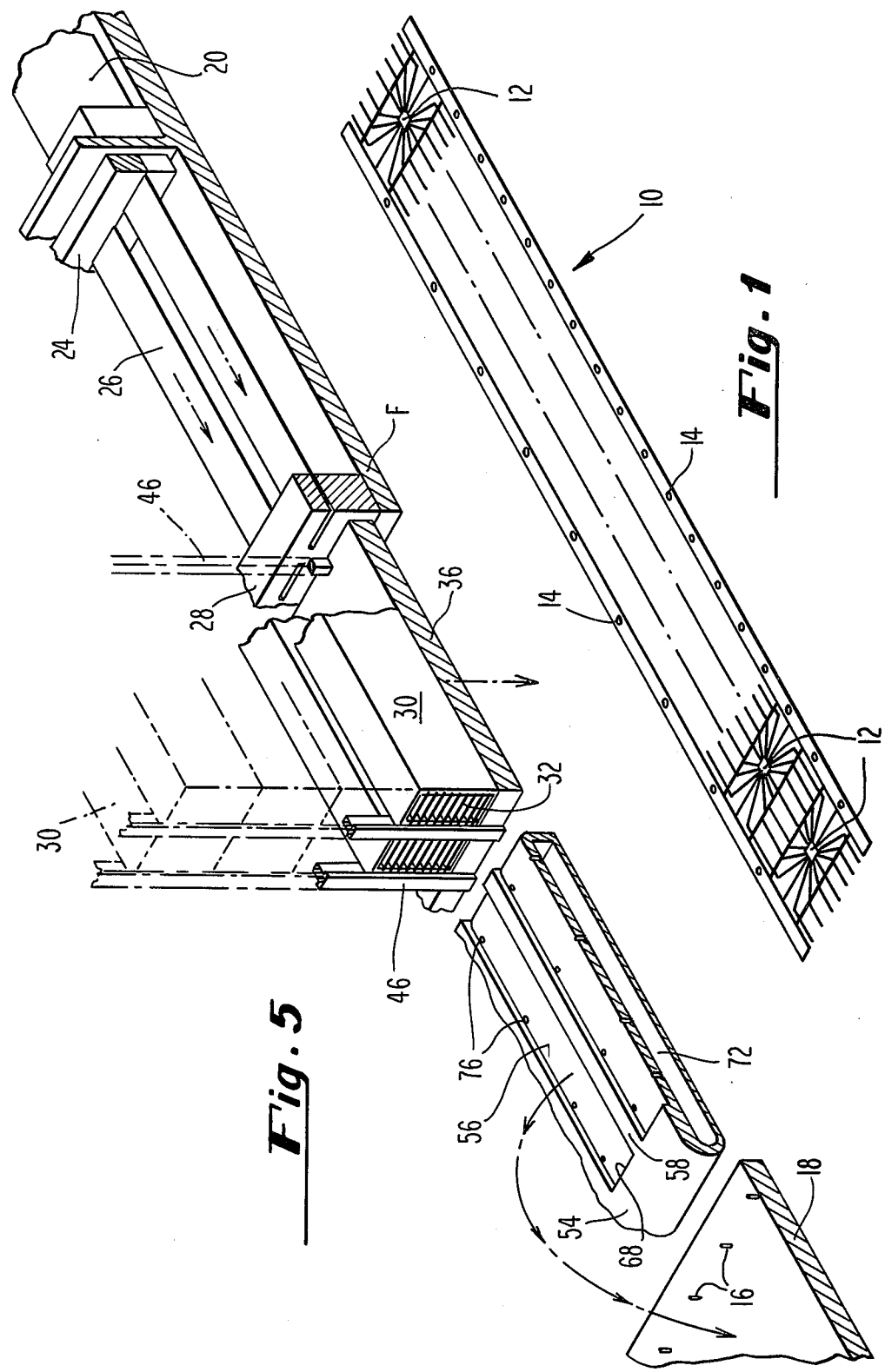
FIG. 1 is a perspective view of a typical lead frame which is to be loaded onto a loading frame in accordance with the present invention.

In FIG. 1, a blank metallic lead frame 10 is provided with a plurality of spaced microcircuit chips 12 bonded thereto. Orifices 14 are provided along the edges of the lead frames for engaging locator pins 16 (FIG. 5) mounted in precise positions on a loading frame 18.

Figure 2:
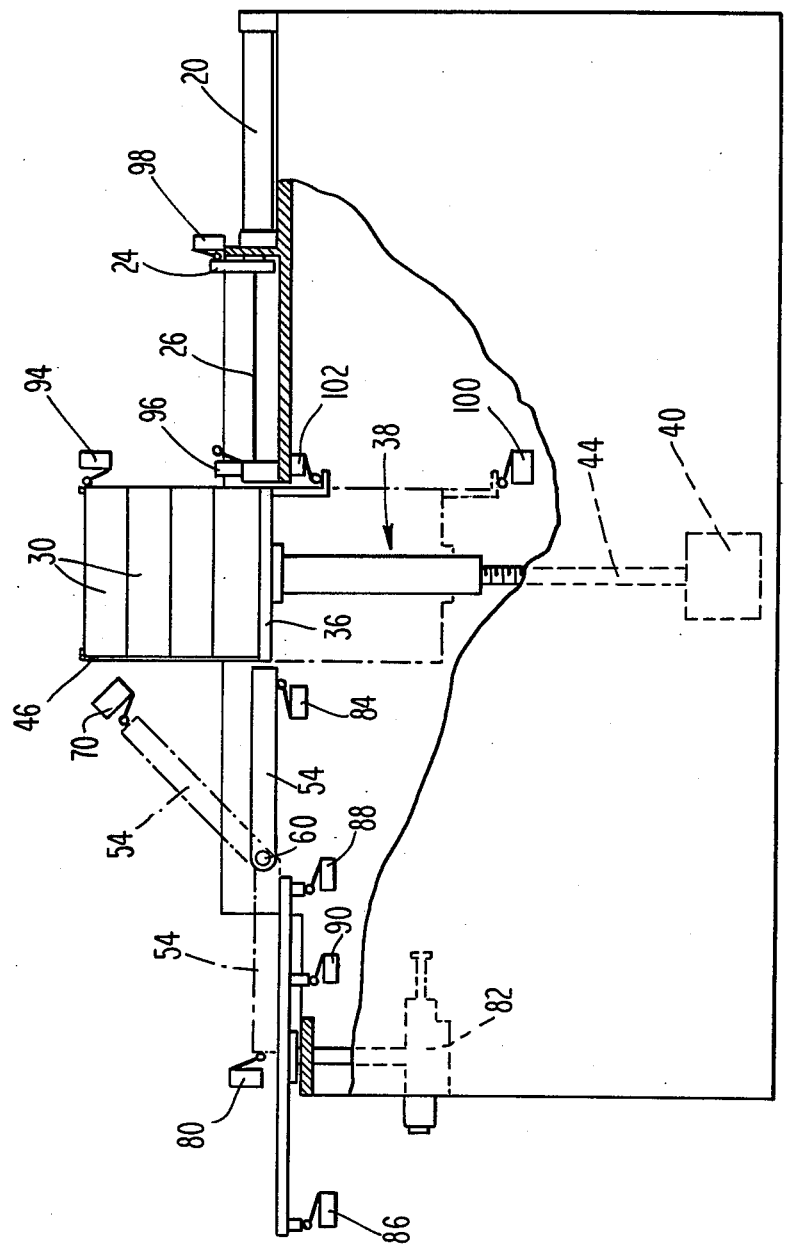
FIG. 2 is an elevational view, partially sectioned, of an embodiment of the present loading machine showing preferred locations of the several limit switches employed therewith.
Figure 3:
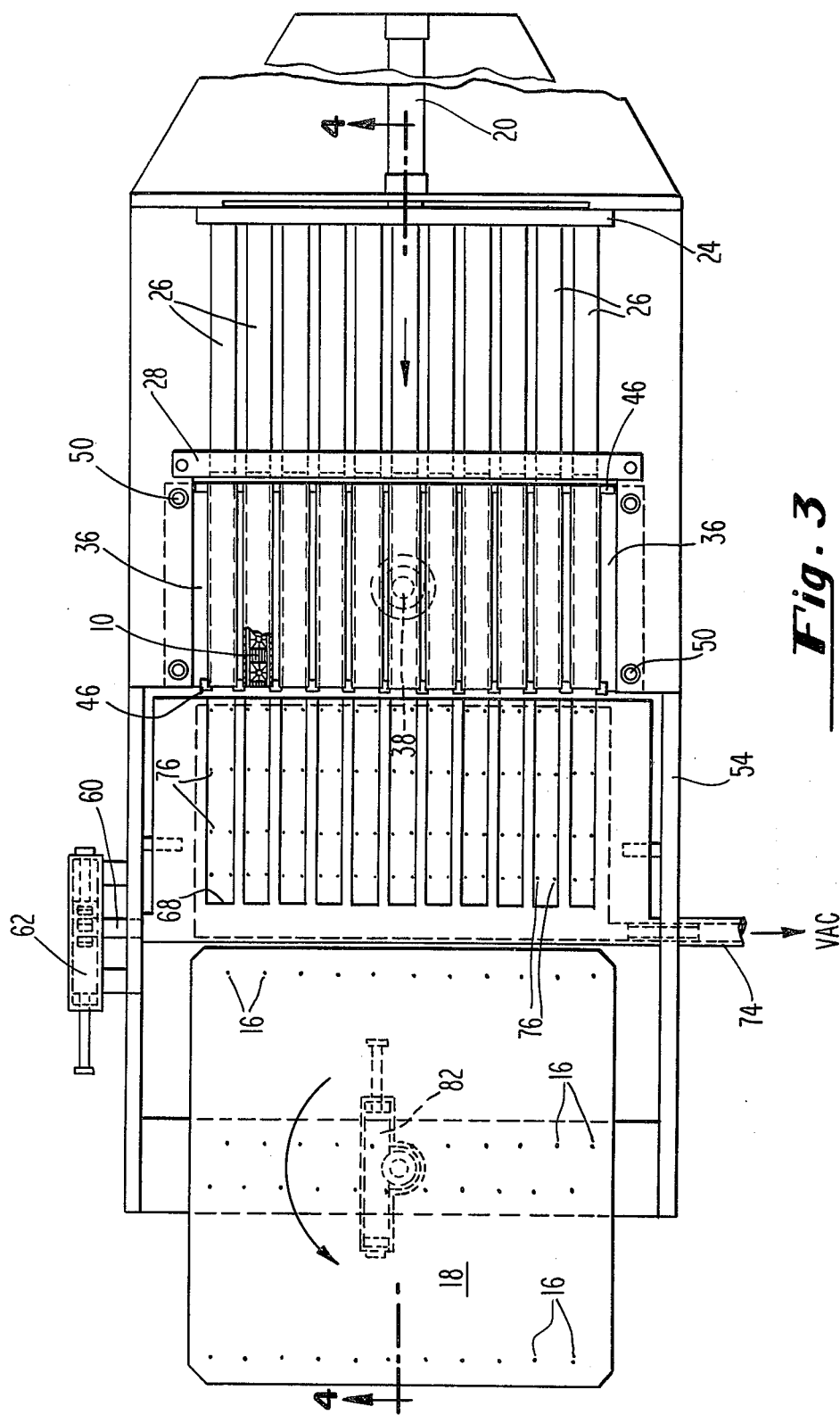
FIG. 3 is a plan view of the loading machine of the present invention.

Referring additionally to FIGS. 2 through 6, an air cylinder 20 is provided with a piston 22. A pusher bar 24 is affixed to end of piston 22 and is provided with a plurality of spaced pushers 26. Pushers 26 are guided by means of a pusher guide bar 28, secured to a stationary frame member F. Although FIG. 3 shows 11 such pushers, it is understood that a greater or lesser number may be employed, preferably 14, typically 10 to 20.

Rows of magazines 30, equal in number to pushers 26, are provided with racks 32 (FIG. 6) veritcally disposed therein, each rack capable of carrying a lead frame 10 thereon. Each magazine 30 will carry from about 10 to 50 lead frames. About 4 to 6 magazines may be stacked vertically, one upon another. Magazines 30 are supported on a platform 36, movable vertically, one magazine upon another. Platform 36 moves vertically by means of a ball screw cylinder 38, for example, disposed centrally thereunder, actuated by a suitable stepping motor 40. Ball screw cylinders are well known and convert rotary motion to linear motion. Ball screw cylinder 38 comprises a nut 42, a screw 44 which is rotatable relative to the nut, and a plurality of balls (not shown) disposed in a closed loop around an inner periphery or peripheries of the nut. The screw 44, of course, is free to rotate, but linear movement thereof is restrained. The nut, however, connected to platform 36, is restrained from rotating and moves vertically upwardly or downwardly depending upon the direction of rotation of the screw.

Figure 4:
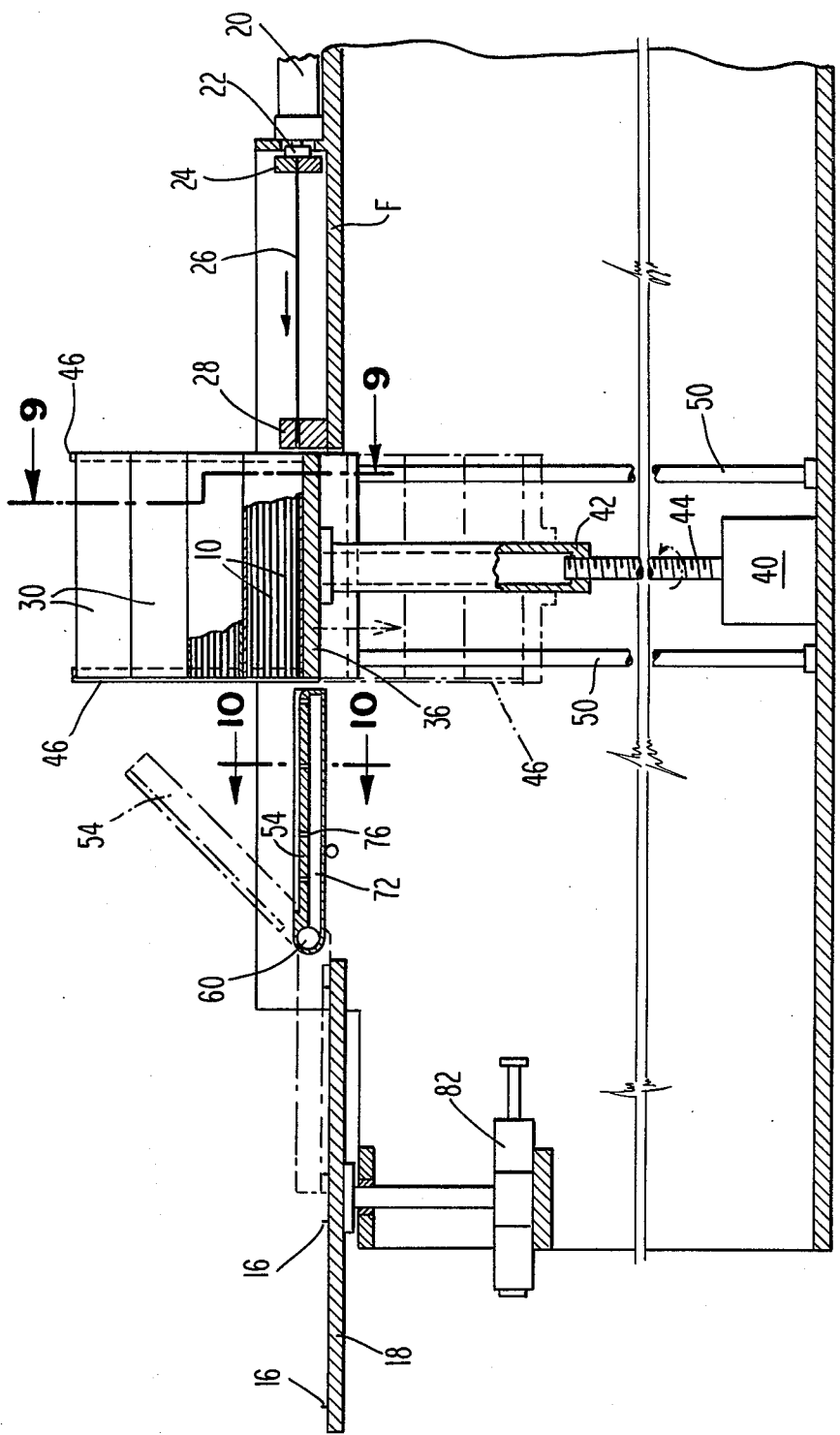
FIG. 4 is a sectional view of the machine of FIG. 3 taken along line 4—4 thereof.

Magazines 30 are supported on platform 36 and stabilized against movement during ejection of lead frames therefrom by means of vertical support members or angles 46 (FIGS. 5 and 9). Platform 36 moves vertically on guide rods 50 located adjacent corners of the platform (FIG. 4).

Stepping motor 40 is designed to lower the platform 0.080"/step in 1 second by means of ball screw cylinder 38, which distance is equivalent to the distance between racks 32 in each magazine. Thus, if a magazine is provided with 20 racks, for example, stepping motor 40 will lower platform 36 in 20 step increments of 0.080 per step. Motor 40 will then step down approximately 1.6" for 1 step, which represents the distance between adjacent racks of successive magazines.

Lead frames 10 within magazine 30 are pushed by pushers 26 onto a nest or nesting member 54 having a plurality of spaced recesses 56 milled therein equal in number to the pushers and magazines. Recesses 56 form partitions 58 (FIG. 5) therebetween which may conveniently measure about ¼" to ⅜". Nest 54 pivots 180° on pivot rod 60 to transfer the lead frames thereon onto loading frame 18.

Rotation or pivoting of nesting member 54 is effected by a commercially available double solenoid 4-way air valve 62 (FIG. 3). The 180° pivot of nest 54 is continuous in either direction, i.e., when transferring the lead frames onto the loading frames or when returning to its original receiving position.

In FIG. 6, lead frames 10 are individually nested within each of recesses 56 of nest 54 after being pushed or ejected thereon from magazines 30. It is seen however that the leading edges of lead frames 10 do not necessarily abut front wall 68 forming a portion of recesses 56. When nest 54 however rotates about 45° (FIG. 7), lead frames 10 slide downwardly in the recesses to position themselves in abutting relationship to front walls 68. Between about 45° and 75° of pivoting of nesting member 54, a limit switch 70 (FIG. 2) is actuated by the nesting member to energize a solenoid-actuated vacuum pump (not shown) to create a partial vacuum in vacuum cavity 72 provided within the nesting member by means of a vacuum line 74 (FIG. 3) connecting the vacuum pump and cavity 72. The resulting reduced pressure within the vacuum cavity is transmitted to a plurality of spaced orifices 76 provided in each of the recesses 56 to thereby maintain the position of the lead frames undisturbed in the recesses 56 until nest 54 continues its uninterrupted pivot to its 180° position illustrated in FIG. 8, at which time and position another limit switch 80 (FIG. 2) de-energizes the vacuum pump to cause the lead frames to drop onto the loading frame 18 such that locator pins 16 thereon engage orifices 14 provided along the edges of the lead frames.

After the vacuum is removed, limit switch 80, through conventional time delay relay means (not shown) causes the 4-way valve 62 to start the nest pivoting back to its original position, and loading plate or frame 18 to rotate 180° in a counterclockwise direction by means of a commercially available 180° indexer 82 (FIGS. 3 and 4) to thereby permit the other half of the loading frame 18 to receive another cycle of lead frames thereon. After loading frame 18 is filled, it may be transferred to the encapsulation press manually or automatically. Return of nest 54 to its original position causes limit switch 84 (FIG. 2) to actuate air cylinder 20 to cause piston 22 to push the pushers 26 through magazines 30 if the magazines are properly indexed.

Typically, loading frame 18 is manually positioned atop an indexing tool plate (not shown). Conventional sensors 86, 88 and 90 (FIG. 2) insure the proper positioning and alignment of loading frame 18 with the indexing tool plate.

In operation, platform 36 is depressed to its lowermost position through ball screw cylinder 38 at which time an operator manually stacks the desired number of magazines 30 in each row. In FIGS. 2, 4 magazines are shown vertically stacked in each row, and 11 rows of such vertically stacked magazines are illustrated in FIG. 3. After the loaded magazines are properly stacked, stepping motor 40 is actuated to start elevating platform 36 until a designated portion of the uppermost magazine of any row of magazines actuates limit switch 94 which thereby de-energizes motor 40. It is appreciated that a limit switch 94 may be employed for each of the 11 rows of magazines. The magazines now assume the position illustrated in FIG. 2. Air cylinder 20 is now actuated which causes piston 22 and pusher bar 24 affixed thereto to extend each of pushers 26 into respective magazines 30 to slide lead frames 10 resting atop racks 32 onto respective recesses 56 of nest 54.

Limit switch 96 is contacted by pusher bar 24 to cause piston 22 to retract by means of the double solenoid 4-way air valve controlling the air cylinder and to initiate pivoting of nesting member 54.

Retraction of piston 22 causes pusher bar 24 to contact limit switch 98 which again extends the piston to effect another cycle.

When the magazines are exhausted of lead frames and platform 36 again reaches its lowermost position, limit switch 100 renders the system inoperable until loaded magazines are properly stacked as abovediscussed. Another limit switch 102 may optionally be included on the machine to prevent motor 40 from being actuated until platform 36 is properly positioned before reloading the magazines.

We claim:

1. Apparatus for automatically rapidly precisely loading lead frames onto a loading frame comprising
    magazine means for vertically storing a plurality of said lead frames,
    nesting means adjacent said magazine means for receiving said lead frames ejected therefrom,
    means for pivoting said nesting means about 180° to invert said lead frames ejected thereon for loading thereof onto said loading frame, said nesting means having recesses therein for completely receiving lead frames longitudinally thereon ejected from said magazine means, said recesses providing front walls with said nesting means for precise positioning of said lead frames individually in said recesses during said pivoting of said nesting means,
    retaining means for maintaining said lead frames in said precise position on said nesting means until completion of said 180° pivot,
    means for releasing said retaining means after completion of said 180° pivot to unload said lead frames onto said loading frame, and
    other means for pushing said lead frames from said magazine means onto said nesting means.

2. Apparatus of claim 1 wherein said lead frames have a plurality of semiconductor microcircuit chips bonded thereto.

3. Apparatus of claim 2 wherein said magazine means are provided with a plurality of racks spaced therein, each of said racks receiving one of said lead frames thereon.

4. Apparatus of claim 3 wherein said magazine means comprise a plurality of magazines vertically stacked to provide a row of vertically stacked magazines, said magazine means further comprising a plurality of rows of said vertically stacked magazines horizontally disposed.

5. Apparatus of claim 4 wherein said nesting means includes spaced recesses therein equal in number to said rows of horizontally disposed magazines, each of said recesses receiving a lead frame ejected from each of said rows of magazines.

6. Apparatus of claim 5 wherein said lead frames within said recesses are precisely positioned therein within about 45° to 75° pivoting of said nesting means.

7. Apparatus of claim 6 wherein each of said recesses of said nesting means is provided with a plurality of orifices communicating with a cavity chamber defined by said nesting means, and said retaining means includes means for imparting a partial vacuum to said cavity chamber and said orifices for maintaining said lead frames in said recesses in said precise positions while said nesting means completes said pivot of 180°.

8. Apparatus of claim 7 wherein said means for pushing said lead frames from said rows of magazines onto said nesting means comprises piston means with a pusher bar secured to piston thereof, a plurality of pushers connected in parallel to said pusher bar and responsive to movement of said piston, said pushers being equal in number to said rows of horizontally disposed magazines.

9. Apparatus of claim 8 wherein said rows of magazines are supported on a platform, means for depressing said platform a specified incremental distance after a lead frame has been ejected from a magazine from each of said rows of magazines onto said nesting means, and means for retracting said pushers from said magazines after ejecting a lead frame therefrom.

10. Apparatus of claim 9 wherein said specified incremental distance is substantially equivalent to distance between said racks in said magazines.

11. Apparatus of claim 10 wherein said means for depressing said platform is a stepping motor controlling rotary to linear conversion means and said stepping motor depresses said platform additional incremental distances between adjacent racks of succeeding magazines.

12. Apparatus of claim 11 wherein said rotary to linear conversion means is a ball screw cylinder.

13. Apparatus of claim 9 wherein said means for retracting said pushers from said magazines is effected by a first limit switch.

14. Apparatus of claim 13 wherein said first limit switch initiates said 180° pivot of said nesting means substantially simultaneously with retraction of said pushers from said magazines.

15. Apparatus of claim 14 wherein a second limit switch de-energizes said means for imparting a partial vacuum to said cavity chamber of said nesting means when said nesting means completes its 180° pivot to cause lead frames precisely positioned thereon to drop onto said loading frame, said second limit switch effecting return pivot of said nesting member to its original receiving position shortly after said means for imparting a partial vacuum to said cavity chamber is de-energized.

16. Apparatus of claim 15 further characterized by locator pins provided in predetermined positions on said loading frame, said lead frames having spaced orifices provided along edges thereof, said nesting member inverting said lead frames by means of said 180° pivot to thereby deposit said lead frames precisely positioned thereon onto said loading frame in precise position by means of said locator pins engaging said orifices of said lead frames.

* * * * *